United States Patent [19]

Kondō et al.

[11] 3,972,765

[45] Aug. 3, 1976

[54] METHOD OF MAKING LAMINATE SHEETS FOR PRINTED CIRCUIT BOARDS

[75] Inventors: Terutake Kondō; Syunya Yokozawa, both of Shimodate, Japan

[73] Assignee: Kitachi Chemical Company, Ltd., Tokyo, Japan

[22] Filed: Mar. 5, 1974

[21] Appl. No.: 448,236

[30] Foreign Application Priority Data

Mar. 5, 1973 Japan.............................. 48-25073

[52] U.S. Cl............................ 156/315; 156/329; 156/330; 156/335; 260/29.2 M; 260/29.3; 427/96; 427/412; 427/407; 428/273; 428/391; 428/436; 428/288; 428/396; 428/447; 428/302; 428/429; 428/901

[51] Int. Cl.².................................................. C09J 5/04

[58] Field of Search ......... 156/308, 286, 228, 307, 156/285, 330, 335, 314, 329, 315; 161/164, 193, 167; 106/287 SB; 339/17 B, 17 R, 17 E; 260/37 EP, 448.2 B, 448.2 N, 29.3, 29.2 M, 838; 117/126 GS; 427/96, 412, 407; 428/273, 428, 391, 447, 415, 901, 417, 285, 396, 288, 429, 302, 436; 65/3 C; 252/8.6; 8/115.6

[56] References Cited

UNITED STATES PATENTS

| | | | |
|---|---|---|---|
| 2,403,872 | 7/1946 | Miller................................ | 428/288 |
| 2,990,307 | 6/1961 | Stalego ........................... | 161/DIG. 4 |
| 3,046,295 | 7/1962 | Lisanke et al. ...................... | 156/315 |
| 3,326,716 | 6/1967 | Hurley et al.................. | 117/126 GS |
| 3,331,885 | 7/1967 | Rider et al.......................... | 260/29.3 |
| 3,554,952 | 1/1971 | Plueddemann .............. | 260/448.2 N |
| 3,617,613 | 11/1971 | Benzinger et al..................... | 156/299 |
| 3,794,555 | 2/1974 | Sanjana................................ | 156/330 |
| 3,839,236 | 10/1974 | Foley et al............................ | 428/429 |

FOREIGN PATENTS OR APPLICATIONS 831,072    3/1960    United Kingdom.................. 156/335

OTHER PUBLICATIONS

"Coupling Agents," Dow Corning Bulletin 03-009, Jan. 1964, pp. 1-4.

Sterman et al., "Silane Coupling Agents etc.," Plastics, July 1963, pp. 1-8.

*Primary Examiner*—William A. Powell
*Assistant Examiner*—J. J. Gallagher
*Attorney, Agent, or Firm*—Armstrong, Nikaido & Wegner

[57] ABSTRACT

In preparing an epoxy resin laminate sheet by impregnating a nonwoven fabric of glass fiber with an epoxy resin to form a prepreg, laminating a predetermined number of so formed prepregs and pressing, while heating, the laminate, when the nonwoven fabric of glass fiber to be used as a substrate is treated with a liquid mixture containing a water-soluble phenol resin and a silane coupler prior to the impregnation step, a laminate sheet suitable for formation of a printed circuit board can be obtained at a low manufacturing cost. The so formed laminate sheet not only has excellent heat resistance, drilling workability and punching workability at room temperature but also is characterized by such an excellent property that when it is subjected to the boiling water treatment, the degree of reduction of electric properties such as the insulation resistance is very small and whitening of the substrate is not caused to occur.

6 Claims, No Drawings

3,972,765

METHOD OF MAKING LAMINATE SHEETS FOR PRINTED CIRCUIT BOARDS

FIELD OF THE INVENTION

This invention relates to a method for preparing epoxy-glass laminate sheets for printed circuit boards with use of a nonwoven fabric of glass fiber. More particularly, the invention relates to a method for preparing epoxy-glass laminate sheets for printed circuit boards, which comprises impregnating a nonwoven fabric of glass fiber with an epoxy resin, drying the impregnated glass fibers to form an epoxy resin-impregnated glass fiber prepreg, laminating a predetermined number of so prepared prepregs, and pressing, while heating, the resulting laminate, wherein the glass fibers are, prior to being impregnated with epoxy resin, treated with a liquid mixture containing a silane coupler and a water-soluble phenol resin.

BACKGROUND OF THE INVENTION

Epoxy resin laminate sheets comprising as a substrate a nonwoven fabric of glass fibers have heretofore been prepared by a method comprising the steps of impregnating a nonwoven fabric of glass fiber with an epoxy resin, drying the impregnated glass fibers to form a prepreg, laminating a predetermined number of so formed prepregs, optionally piling a metal foil such as copper foil on the laminate, and then pressing, while heating, the laminate between mirror-polished iron plates. Laminate sheets prepared according to this conventional method with use of a nonwoven fabric of glass fiber have good heat resistance comparable to that of epoxy resin laminates prepared by employing a woven fabric of glass fibers as a substrate, and they are excellent in drilling workability and punching workability.

Epoxy resin laminate sheets prepared according to the above conventional method by employing a nonwoven fabric of glass fiber as a substrate, however, are very poor in moisture resistance, and they are fatally defective in that when they are subjected to the boiling water test, reduction of the insulation resistance is extreme and the substrate is whitened. Therefore, when these laminate sheets are used for formation of printed circuit boards, they hardly satisfy requirement standards specified with respect to epoxy resin laminate sheets comprising a substrate of a glass fiber woven fabric or a paper substrate for use in production of printed circuit boards.

It is believed that the above fatal defect of an epoxy resin laminate sheet comprising a nonwoven fabric of glass fiber as a substrate is due to a binder used for formation of the nonwoven fabric of glass fiber. The nonwoven fabric of glass fiber used in this field includes a glass mat and a glass paper, and it is generally formed by shaping glass fibers having a diameter of several microns or shortly cut products thereof into a thin sheet or paper. It is known that at this step, as a medium for bonding the glass fibers, there are employed (1) chemicals or resin (the product is hereinafter referred to as "substrate A") and (2) a cellulose fiber (the product is hereinafter referred to as "substrate B"). Such bonding medium of binder has bad influences on properties of laminate sheets for use in producing printed circuit boards. A method comprising treating a nonwoven fabric of glass fiber with a silane coupler may be considered as means for improving this defect. According to this method, however, in the case of the substrate A a large amount of the silane coupler should be used for the treatment and the manufacturing cost becomes high, and in the case of the substrate B no improvement of properties can be attained.

We have made investigations on epoxy resin laminate sheets comprising a nonwoven fabric of glass fiber as a substrate, expecially those for printed circuit boards, with a view to developing a method in which the foregoing fatal defect can be overcome and the properties of these epoxy resin laminate sheets can be improved at a lower cost, and as a result it has now been found that good results can be obtained when a nonwoven fabric of glass fiber to be used to be used as a substrate is treated with a liquid mixture containing a watersoluble phenol resin and a silance coupler.

OBJECTS OF THE INVENTION

It is, therefore, a primary object of this invention to provide a method of making an epoxy-glass laminate sheet for a printed circuit board in which such properties as the resistance to the boiling water test are highly improved at a low cost though a nonwoven fabric of glass fiber is employed as a substrate.

Another object of this invention is to provide a method of making an epoxy-glass laminate sheet comprising a substrate of a nonwoven fabric of glass fiber which is comparable or superior to conventional epoxy-glass laminate sheets comprising a glass cloth substrate or paper substrate with respect to the heat resistance, the drilling workability, the punching workability at room temperature and the resistance to the boiling water test.

Other objects, features and advantages of this invention will be apparent from the following description.

DETAILED DESCRIPTION OF THE INVENTION

This invention relates to an improvement of the method of making epoxy-glass laminate sheets comprising a nonwoven fabric of glass fiber as a substrate, which comprises the steps of impregnating a nonwoven fabric of glass fiber with an epoxy resin, drying the resulting fabric of glass fiber to form a prepreg, laminating a predetermined number of so formed prepregs, and then pressing, while heating, the laminate to obtain an epoxy-glass laminate sheet for production of a printed circuit board, said improvement being characterized in that the nonwoven fabric of glass fiber is treated with a liquid mixture containing a silane coupler and a water-soluble phenol resin prior to the step of impregnating the nonwoven fabric of glass fiber with the epoxy resin.

This invention will now be detailedly explained.

As described above, the method of this invention is characterized in that a nonwoven fabric of glass fiber used as a substrate is treated with a liquid mixture containing a silane coupler and a water-soluble phenol resin prior to impregnation of the nonwoven fabric with an epoxy resin. In general, the liquid mixture to be used for this treatment is formed by dissolving a water-soluble phenol resin and a silane coupler into a mixed solvent of water and an alcohol. Water can also be employed as the solvent. The weight ratio of the water-soluble phenol resin to the silane coupler in the liquid mixture may be, in a solid base, 1/0.01–0.5 for use for the substrate A and 1/0.001–0.1 for use for the substrate B. The concentration of the liquid mixture may be 1 – 10 % by weight. When too large an amount of a silane coupler is contained in the liquid mixture, the properties of the obtained substrate are improved but, disadvantageously the cost becomes comparatively high and the life of the liquid mixture is shortened. Then use of an alcohol as a component of the solvent for the liquid mixture makes it easy to form a prepreg after impregnation of the substrate with epoxy resin. The final product laminate sheet obtained through the use of alcohol is not different in properties from that obtained through the use of water only. Examples of alcohols to be employed as a component of the solvent include methyl alcohol, ethyl alcohol and isopropyl alcohol. When the mixed solvent of water and an alcohol is used, the mixing weight ratio is not critical but water/alcohol = 1/0.5 – 2.0 is preferably employed. As the silane coupler, there can be mentioned, for example, γ-ethylenediaminopropyltrimethoxysilane, γ-glycidoxypropyltrimethoxysilane, γ-aminopropyltrimethoxysilane and γ-chloropropyltrimethoxysilane. Any of water-soluble phenol resins can be used in this invention. For example, there is preferably employed a phenol resin prepared by reacting a phenol with formaldehyde or paraformaldehyde in the presence of a catalyst at 40° – 100°C. for 2 – 50 hours and composed mainly of dimers and trimers. As the phenol, there may be employed phenol, cresol, xylenol, isopropylphenol, tert.-butylphenol, octylphenol, bisphenol A and the like. Examples of the catalyst include an alkali such as sodium hydroxide or potassium hydroxide, ammonia, or an amine such as triethanolamine.

A nonwoven fabric of glass fiber is immersed in the so formed treating liquid and then the treating liquid-impregnated nonwoven glass fabric is dried at 120° – 150°C. for 5 – 15 minutes. Then, the so treated nonwoven glass fabric is impregnated with an epoxy resin and then dried to obtain a prepreg of the so called B-stage. As the epoxy resin, there may be employed those as employed in the conventional art (See, for example Japanese patent publication No. 3237/1973). With use of a suitable or predetermined number of the so prepared prepregs, a laminate sheet is prepared according to the customary method known in the art (See, for example Japanese patent publication No. 47109/1972). The so prepared laminate sheet is characteristic over a conventional laminate sheet comprising as a substrate a nonwoven fabric of glass fibers in that when it is immersed in boiling water, reduction of the electric resistance is very small and no whitening is observed in the substrate.

As described, in conventional epoxy-glass laminate sheets comprising as a substrate a nonwoven fabric of glass fiber, there are brought about some disadvantages when they are immersed in boiling water. For example, in the case of the substrate A, a chemical or resin used as a binder is readily dissolved out in boiling water, and moisture is readily absorbed in voids formed by dissolving-out of the binder or glass fibers are readily peeled off from the epoxy resin, with the result that electric properties are drastically degraded and the substrate is whitened. In order to prevent occurrence of such undesired phenomena, in this invention it is indispensable that a nonwoven fabric of glass fiber to be used as a substrate is treated with the above-mentioned treating liquid containing a water-soluble phenol resin and a silane coupler. In the case of the substrate A, it is believed that when the substrate is treated with the treating agent of this invention, the bonding medium such as a chemical or resin is coated with the treating agent or insolubilized thereby, and the bonding between the glass fibers and epoxy resin is reinforced by the silane coupler. As a result of this dissolving-out of the binder and peeling of the glass fiber from the epoxy resin can be effectively prevented at the boiling water treatment. Further, in the case of the substrate B, the moisture-absorbing property of cellulose fibers incorporated as the bonding medium is effectively lowered by the treatment of this invention and the bonding between the glass fibers and epoxy resin is effectively improved. Thus, the above-mentioned defects involved in conventional epoxy resin laminate sheets comprising as a substrate a nonwoven fabric of glass fibers can be completely overcome according to the method of this invention, and epoxy resin laminate sheets suitable for production of printed circuit boards can be conveniently prepared by employing a nonwoven fabric of glass fiber as a substrate according to the method of this invention.

The above description is made in respect of the epoxy-glass laminate sheet comprising a prepreg produced using a nonwoven fabric of glass fiber which was pretreated according to this invention and then impregnated with an epoxy resin. However, it is to be noted that the prepreg produced using a woven fabric of glass fiber which was optionally pretreated and impregnated with an epoxy resin may be employed together with the prepreg produced according to this invention to produce an epoxy-glass laminate sheet; for example, the prepreg produced using the woven fabric may be attached onto the surface of present prepreg produced using nonwoven fabric or may be sandwiched between the present prepregs to produce another type of epoxy-glass laminate sheet.

This invention will now be illustrated more detailedly by reference to Examples, which by no means limit the scope of this invention.

EXAMPLE 1

Glasstex 936 G (nonwoven fabric of glass fiber manufactured and sold by Mead Co., U.S.A.) was impregnated with an about 1 % aqueous solution of a mixture of γ-ethylenediaminopropyltrimethoxysilane/water-soluble phenol resin (solid component weight ratio = 0.01–0.1/1) and the impregnated nonwoven fabric of glass fiber was dried in air at 140° – 150°C. for 10 – 15 minutes. As the water-soluble phenol resin, the resin which had been obtained by reacting 1 mol of phenol and 1.4 mol of formaldehyde in the presence of 0.1 mol of trimethylamine at 85°C. for 6 hours was employed (in Examples 2 and 3 also, the same was employed). The so treated Glasstex 936 G was further impregnated with an epoxy resin solution (formed by dissolving 100 parts by weight of an epoxy resin having 400 – 500 epoxy equivalents, 4 parts by weight of dicyandiamide and 0.2 part by weight of benzyldimethylamine into 60 parts by weight of a mixed solvent of methyl glycol and methyl ethyl ketone) and was dried at about 130° to about 150°C. for 10 – 15 minutes to obtain a prepreg of the B-stage. As the epoxy resin, EPIKOTE 1001 (trade name of epoxy resin manufactured by Shell Chem. Corp.) is employed. Then, about 20 sheets of so formed prepregs were piled and hot pressed at a temperature of about 80°C. under a pressure of about 20 Kg/cm$^2$ in the state inserted between mirror-polished iron plates to obtain a laminate sheet having a thickness of about 1.6 mm.

In order to examine electric properties of the laminate sheet and the degree of whitening of the substrate, the so obtained laminate sheet was dipped in boiling water for 120 minutes according to the test method of JIS C-6481, and the insulation resistance was measured and the appearance was inspected. It was found that the insulation resistance was $(1.0 - 5.0) \times 10^{15} \Omega$ under normal conditions and it was reduced to $(1.0 - 5.0) \times 10^{10} \Omega$ by the boiling water treatment. The whitening was not observed on the substrate even after the boiling water treatment.

For comparison, a laminate sheet was prepared from Glasstex 936 G in the same manner as described above except that the treatment of this invention was not conducted. The insulation resistance of the sheet was $(1.0 - 5.0) \times 10^{15} \Omega$ under normal conditions and it was reduced to $(1.0 - 5.0) \times 10^{7} \Omega$ by the above boiling water treatment. Further, the substrate was whitened in this comparative laminate sheet by the above boiling water treatment.

For another comparison, a laminate sheet was prepared from Glasstex 936 G in the same manner as described above except that the Glasstex was treated with an aqueous solution containing γ-ethylenediaminopropylmethoxysilane alone. In this case, it was found that in order to obtain a product having properties equivalent to those of the above laminate sheet prepared by treating Glasstex 936 G according to this invention, it was necessary to increase the silane concentration in the treating liquor to above 2.0 %.

EXAMPLE 2

Glasstex 936 G was impregnated with an about 2 % aqueous solution of a mixture of γ-glycidoxypropylmethoxysilane/water-soluble phenol resin (solid component weight ratio = 0.1 - 0.5/1) and the impregnated nonwoven fabric of glass fiber was dried in air at 140° - 150°C. for 10 - 15 minutes. From the so treated fabric of glass fiber, a laminate sheet was prepared under the same conditions as in Example 1 and was subjected to the same test as described in Example 1. The insulation resistance of the laminate sheet was $(1.0 - 5.0) \times 10^{15} \Omega$ under normal conditions and it was reduced to $(3.0 - 7.0) \times 10^{9} \Omega$ by the boiling water treatment. It was found that no substantial whitening was caused to occur in the substrate by the boiling water treatment.

EXAMPLE 3

A nonwoven fabric of glass fiber of the substrate B type (containing 40 % of cellulose fibers) was immersed in an about 10 % solution of a mixture of γ-ethylenediaminopropyltrimethoxysilane/water-soluble phenol resin (solid component weight ratio = 0.01 - 0.1/1) in the mixed solvent of water and methyl alcohol (1/1 by weight) and was then dried at 140°- 150°C. for 10 - 15 minutes. The so treated nonwoven fabric of glass fiber was impregnated with the same epoxy resin solution as used in Example 1 and dried at 130° - 150°C. for 10 - 15 minutes to obtain a prepreg of the B-stage. Then, about 15 sheets of so prepared prepregs were piled and hot pressed under the same conditions as adopted in Example 1 to obtain a laminate sheet having a thickness of about 1.6 mm. It was found that the insulation resistance of the laminate sheet was $(1.0 - 5.0) \times 10^{15} \Omega$ under normal conditions and it was reduced to $(1.0 - 3.0) \times 10^{11} \Omega$ by the boiling water treatment described in Example 1. Whitening of the substrate was not observed at this boiling water treatment.

For comparison, a laminate sheet was prepared in the same manner as above except that the treatment of this invention was not conducted. The insulation resistance of the comparative laminate sheet was $(1.0 - 5.0) \times 10^{15} \Omega$ under normal conditions and it was reduced to $(5.0 - 9.0) \times 10^{6} \Omega$ by the boiling water treatment. Further, the substrate of the comparative laminate sheet was whitened by the boiling water treatment.

When examples 1 and 2 were repeated by employing Hiaron GP (manufactured and sold by Tokushu Seishi K.K.) and Glass Paper GMN (manufactured and sold by Honshu Seishi K.K.) instead of Glasstex 936 G, similar results were obtained.

As is apparent from the results of the foregoing Examples, an epoxy-glass laminate sheet prepared from a nonwoven fabric of glass fiber treated with both a silane coupler and a water-soluble phenol resin according to this invention is characteristic over an epoxy-glass laminate sheet prepared from an untreated nonwoven fabric of glass fiber in that the degree of reduction of the insulation resistance by the boiling water treatment is much smaller and the insulation resistance can be retained at a much higher level after the boiling water treatment, and that in this laminate sheet prepared according to this invention, no substantial whitening of the substrate is caused to occur by the boiling water treatment. Further, this epoxy-glass laminate sheet prepared according to this invention can also fully meet the general standard requirements specified with respect to epoxy-glass laminate sheets comprising glass fiber cloth substrate, a paper substrate or the like.

The method of this invention has such advantages over the conventional method comprising treating a nonwoven fabric of glass fiber with a silane coupler alone that the amount of the treating agent necessary for attaining the desired effect is much smaller and the treatment cost can be much reduced.

What is claimed is:
1. In a method of making an epoxy-glass laminate sheet comprising a nonwoven fabric of glass fiber as a substrate, which comprises the steps of impregnating a nonwoven fabric of glass fiber with an epoxy resin, drying the resulting fabric of glass fiber to form a prepreg, laminating a predetermined number of so formed prepregs, and then pressing, while heating, the laminate to obtain an epoxy-glass laminate sheet for production of a printed circuit board, the improvement wherein the nonwoven fabric of glass fibers is treated with a liquid mixture containing a silane coupler and a water-soluble phenol resin prior to the step of impregnating the nonwoven fabric with the epoxy resin.

2. A method according to claim 1 wherein said liquid mixture contains as a solvent water or a mixture of water and an alcohol.

3. A method according to claim 1 wherein said silane coupler is a member selected from the group consisting of γ-ethylenediaminopropyltrimethoxysilane, γ-glycidoxypropyltrimethoxysilane, γ-aminopropyltrimethoxysilane and γ-chloropropyltrimethoxysilane.

4. A method according to claim 1 wherein said phenol resin is one prepared by reacting phenol with formaldehyde in the presence of a catalyst at 40° - 100°C. for 2 - 50 hours and composed mainly of dimers and trimers.

5. A method according to claim 1 wherein said nonwoven fabric of glass fiber is one in which a chemical or resin is used as a medium for bonding the glass fiber.

6. A method according to claim 1 wherein said nonwoven fabric of glass fiber is one in which cellulose fibers are incorporated as a medium for bonding the glass fibers.

* * * * *

UNITED STATES PATENT OFFICE
CERTIFICATE OF CORRECTION

Patent No. 3,972,765             Dated August 3, 1976

Inventor(s) Terutake Kondo et al

It is certified that error appears in the above-identified patent and that said Letters Patent are hereby corrected as shown below:

ASSIGNEE'S name is: HITACHI CHEMICAL COMPANY, LTD.

Signed and Sealed this

Second Day of November 1976

[SEAL]

Attest:

RUTH C. MASON
Attesting Officer

C. MARSHALL DANN
Commissioner of Patents and Trademarks